United States Patent [19]

Wouters et al.

[11] Patent Number: 4,915,245

[45] Date of Patent: Apr. 10, 1990

[54] ELECTROSTATIC-SAFE, AIR-POWERED, MINIATURE VACUUM GENERATOR

[75] Inventors: Alfred Wouters, San Dimas; Suzan D. Weber, Ontario; Michael J. Maciocia, Rancho Cucamonga, all of Calif.

[73] Assignee: General Dynamics Corp., Pomona Div., Pomona, Calif.

[21] Appl. No.: 193,861

[22] Filed: May 12, 1988

[51] Int. Cl.⁴ .............................................. A47L 5/18
[52] U.S. Cl. ...................................... 215/326; 15/409
[58] Field of Search ................. 15/406, 409, 326, 344, 15/415 R

[56] References Cited

U.S. PATENT DOCUMENTS

| | | |
|---|---|---|
| 1,253,535 | 1/1918 | Rosenfield . |
| 1,334,430 | 3/1920 | Ayotte . |
| 1,802,290 | 4/1931 | Thrower . |
| 1,986,476 | 1/1935 | Ironside . |
| 2,253,310 | 8/1941 | Smellie . |
| 2,426,315 | 8/1947 | Marick . |
| 2,665,443 | 1/1954 | Simon et al. . |
| 2,746,078 | 5/1956 | Spurlin . |
| 2,937,802 | 5/1960 | Fisher ................................ 15/409 |
| 3,308,608 | 3/1967 | Brimberg . |
| 3,525,118 | 8/1970 | Viollet . |
| 3,562,846 | 2/1971 | Creamer et al. . |
| 3,761,996 | 10/1973 | Tell . |
| 3,882,961 | 5/1975 | Cannan et al. . |
| 3,897,604 | 8/1975 | Weimer ............................. 15/409 |
| 3,971,096 | 7/1976 | Renholt . |
| 3,973,642 | 8/1976 | Dahlquist . |
| 4,221,017 | 9/1980 | Fortune ............................ 15/409 |
| 4,586,386 | 5/1986 | Hollstein et al. ............... 15/409 |
| 4,686,737 | 8/1987 | Fortune .......................... 15/415 R |

FOREIGN PATENT DOCUMENTS

| | | |
|---|---|---|
| 46832 | 1/1933 | Denmark . |
| 2625701 | 12/1977 | Fed. Rep. of Germany ........ 15/409 |
| 758863 | 1/1934 | France . |

Primary Examiner—Chris K. Moore
Attorney, Agent, or Firm—Henry M. Bissell; Leo R. Carroll

[57] ABSTRACT

A miniaturized vacuum generator is powered by pressurized air, such as is commonly available in shop air lines. The generator includes a transducer coupled to the pressurized air line and utilizing the venturi principle to develop a vacuum at a vacuum port to which a vacuum hose may be coupled. This may be used in cleaning circuit boards and small electronic assemblies to pick off bits of solder, filings and other debris and contaiminants which more conventional vacuum cleaners do not effectively remove. The apparatus includes an in-line filter for collecting such debris and contaiminants and preventing them from being blown about by the exhaust. The apparatus may also be used as a pickup device for microchips and other miniature complements on an electronic assembly at a production line. Other uses of the device may be in the jewelry repair field where the debris to be picked up often contains dust and filings of precious metal and, occasionally, lost gemstones. The inline filter admits of ready disassembly for recovery of such materials. The device works without moving parts and is fabricated to a considerable extent from static dissipative materials to prevent the buildup of electrostatic charge which might damage charge-sensitive microchips and other components being handled or worked upon.

13 Claims, 3 Drawing Sheets

ELECTROSTATIC-SAFE, AIR-POWERED, MINIATURE VACUUM GENERATOR

BACKGROUND OF THE INVENTION

1. Field of the Invention

This invention relates to small air-powered vacuum sources and, more particularly, to an airflow-type vacuum inducing unit which is quiet in operation and safe to use in an environment where electrostatic discharges cannot be tolerated.

2. Description of the Related Art

There has long been a need in the microelectronics industry for a small vacuum generator that can be used conveniently to clean hard-to-reach places and to manipulate fragile miniature components such as microchips. An additional requirement is that such a device can be used in a cleanroom environment. Also, it is often necessary that the device be used under circumstances in which the generation of any kind of electrostatic charge is unacceptable. The types of vacuum cleaners which are known generally fail to provide these desirable features in combination. Moreover, such vacuum cleaners as are generally used in electronic assembly areas to remove contamination and debris during manual handling operations of circuit boards, electronic assemblies and the like are generally noisy and somewhat ineffective. Other small vacuum cleaners which have become popular with the advent of personal computers and are principally designed to withdraw dust, hair and lint from computer keyboards are simply too lightweight and low powered to be effective in a shop or electronic assembly line environment in serving the present need. Apparatus of the present invention avoids the drawbacks associated with conventional vacuum cleaners by using a quieter source of power and a principle of operation without reliance on motors or other moving parts. Embodiments in accordance with the present invention utilize the venturi principle to develop reduced pressure in a tube from the flow of high velocity air across the tube. Such a device may be considered a vacuum generator and is used to develop the vacuum which is employed in the present invention.

Some examples of prior art related to tools which use a vacuum produced by airflow include the following:

U.S. Pat. No. 1,334,430 to Ayotte relates to dust collectors for drills and in particular to a means for collecting dust and particles created by the drill so as to prevent the same from mingling with the air in a mine and affecting the health of the miners. A tubular casing is adapted to surround a drill bit and receive the dust and rock particles thrown off by the bit. The casing is connected to the bent end of a pipe which extends parallel with the drill bit and has its other end connected with the bent end of a second pipe which communicates with a detachably secured dust collecting bag. Suction in the casing is created by the flow of compressed air through a nozzle extending into the end of the second pipe. Dust created by the drill passes with the air coming from the nozzle through the second pipe into the collecting bag. The air passes through the meshes of the fabric of the bag while the dust is caught and held by the bag.

U.S. Pat. No. 1,802,920 to Lee is directed to a device for cleaning molds and patterns or the like. A hollow body member is provided with a tube connected to the bottom of the hollow body member. A valve-controlled air inlet is provided on the device which is connected to a supply of air under pressure by means of a flexible conduit. One end of the hollow body member is open and provided with a closure member which may be hinged to the body member but is normally held open by a spring. The tool is operated by inserting the tube in a mold, for example, and operating the valve to permit air flow through the hollow body member to create a suction which sets up a flow of air through the tube. The tube can be manipulated within the mold to remove dirt or other extraneous matter by means of the suction created.

U.S. Pat. No. 1,986,476 to Ironside relates to a device for transferring liquids between different containers, in particular heavy oils and fluid greases. A relatively small and portable closed tank is provided which has a top wall through and from which a conduit extends. The conduit end within the tank cavity is disposed adjacent to the bottom of the cavity while a flexible hose of required length is coupled to the outer conduit end. If a sub-atmospheric pressure is created in the tank cavity while the free end of the hose is immersed in a liquid, the liquid is drawn into the tank through the hose so long as the sub-atmospheric pressure obtains. On the other hand, if the tank contains liquid above the bottom end of the conduit and a pressure exceeding atmospheric is created in the tank, the liquid is forced from the tank through the conduit and hose so long as the conduit end is immersed and the pressure exceeds that of the atmosphere. Means for providing the desired pressure conditions in the tank comprise an air compressor and a control means connected between the tank and a hose from the compressor. The control means comprises a body through which an air passage extends longitudinally, and the passage is divided to define two portions by means of a nozzle disposed therein. Mounted in one of the passage portions to extend axially therethrough and therefrom is a tubular member with a bore aligned with the nozzle bore whereby air discharged from the nozzle will move freely into the bore. When an airstream under pressure is introduced through the nozzle, its flow through the bore draws air with it from the passage portion so as to create a vacuum therein, with the result that the continued removal of air draws air from the tank cavity.

U.S. Pat. No. 3,525,118 to Viollet discloses a special adaptation of a machine shop blow gun apparatus having vacuum and blow extension members mounted on a standard blow gun so as to be connected with each other and also to a source of a compressed air. The blow gun has a blow extension opening that can be covered so as to direct the compressed air out the end of the member that functioned as a vacuum member before the exhaust member was closed.

U.S. Pat. No. 761,996 to Tell is directed to a pen-shaped suction tool for collecting and keeping small particles and other objects. The suction is generated by an ejector contained in the tool. Suction is started by closing an outflow opening for air under pressure supplied to the tool, which opens a valve through the displacement of a piston. The valve and piston are located in a common cylindrical chamber.

U.S. Pat. No. 3,971,096 to Renholt relates to a pressurized air-driven suction device comprising one or more nozzles for ejecting pressurized air and including appurtenant venturi tubes situated in an elongated tubular ejector housing. If desired, the ejector housing may be provided with a silencer. A suction air pipe for supplying suction air is also mounted in the ejector housing, which is itself mounted through the end plate of a container such as an oil drum having plug holes.

Two examples of prior art related to the elimination of electrostatic discharges are described briefly below.

U.S. Pat. No. 2,426,315 to Marick is directed to a static-free brush produced by depositing upon the bristles thereof a thin electrically conducting coating and making the head in which the bristles are mounted and the brush handle conductive. A static charge at the bristles is conducted to the hand and dispersed over the body of the person using the brush.

U.S. Pat. No. 2,665,443 to Simon et al relates to the reduction or elimination of static electricity from a hairbrush or comb by dipping it in a dilute dispersion of particular chemical substances and then drying it. The substances disclosed are defined as certain long-chain fatty-acid partial esters.

None of the patents described above discloses an air-powered miniature vacuum generator for the cleaning of electronic assemblies or the manipulation of small parts that is extremely quiet in operation, will capture both liquid and particulate contaminants, and not present an electrostatic discharge problem to components.

SUMMARY OF THE INVENTION

In brief, arrangements in accordance with the present invention comprise a small, lightweight, portable, handheld vacuum cleaner which is particularly effective for vacuum cleaning small parts, electronic circuit boards and the like in an electrical apparatus production facility and in similar environments. The unit is driven by pressurized air from air lines that are readily available in such facilities to develop a vacuum at a pneumatic flow rate which is appropriate for the described purpose. Because it is not powered by an electric motor and it has no moving parts, it is significantly quieter and less susceptible to generating static electric charge than conventional units which have been available heretofore.

The preferred embodiment of the invention comprises a transducer, an exhaust muffler, an in-line strainer or trap, an insulated case, a control valve and appropriate hoses and/or tubing to connect the unit to shop air lines and to transmit the vacuum to the point of application.

The transducer is a type of device sometimes referred to as a vacuum venturi or a vacuum generator. These are commercially available and may be obtained, for example, from Pat Dooley Company, Inc. of Fawnskin, California. One particular model which has been found effective for inclusion in embodiments of the present invention is their Model PD-093.

This particular transducer draws a vacuum of up to 14 inches of mercury when coupled to a 40 psi (pounds per square inch) shop air line. The transducer directs the shop air flow through a venturi chamber and to the exhaust where it is passed through the associated exhaust muffler before being released to atmosphere. A small hole within the body of the transducer and which is connected to a vacuum port creates a partial vacuum due to the the venturi effect. This is passed to a vacuum line which is connected to the port. The level of vacuum at the transducer vacuum port varies with input pressure of the air supply. The exhaust muffler is attached to an output port of the transducer to reduce the noise level which is mainly due to the air flow through the device. An associated control valve permits the user to toggle the device on or off, thereby avoiding the drain on the air line when the vacuum unit is not in use. The inline strainer/trap includes an air filter, such as a paper or mesh screen, to filter and retain either or both solid and liquid contaminants. This trap is installed at the vacuum port of the transducer, in line with the vacuum hose, to filter the air coming from the vacuum line. The vacuum hose is a small diameter (less than 1 inch) flexible plastic hose. This hose is transparent and is fabricated of suitable material so that it dissipates static charge. It is capable of using various types of pickup nozzles, depending on the application in which the device of the invention is used.

The transducer and the exhaust muffler are enclosed within a static dissipative case or housing which is ventilated to release the exhaust. This assembly is insulated with an appropriate material, preferably static dissipative foam, to attenuate noise and prevent the buildup of electrostatic charge. The measured level of sound for a particular prototype of the present invention is 65 decibels at a distance of 2 inches from the decibel meter. By contrast, conventional shop vacuums generate a noise level in the 90 to 95 decibel range.

BRIEF DESCRIPTION OF THE DRAWING

A better understanding of the present invention may be realized from a consideration of the following detailed description, taken in conjunction with the accompanying drawing in which.

DESCRIPTION OF THE PREFERRED EMBODIMENTS

Figure 1:
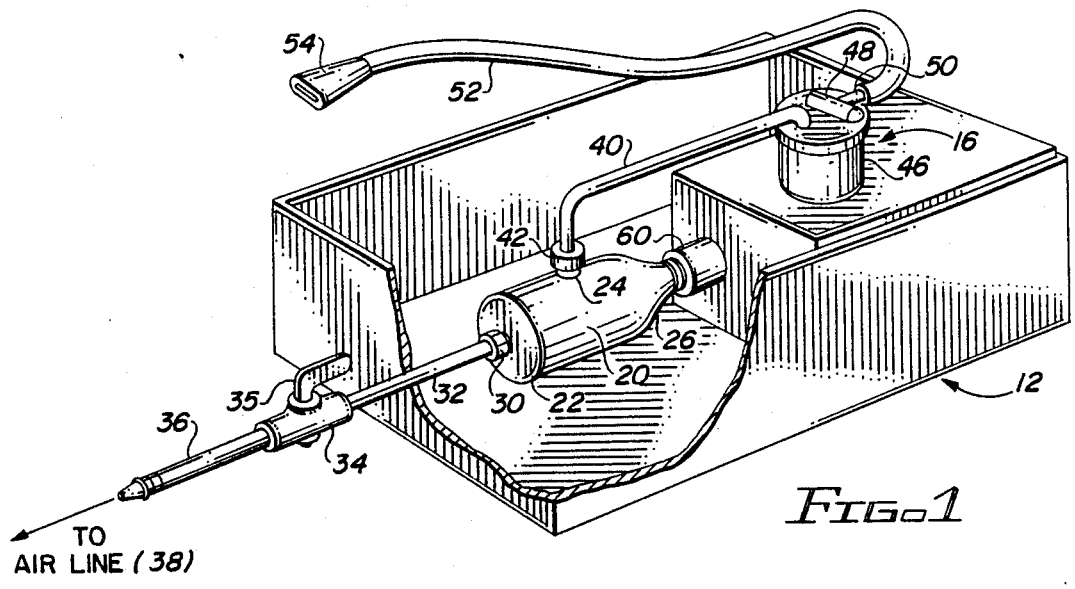
FIG. 1 is a perspective view, partially broken away, of one particular arrangement in accordance with the invention.
Figure 2:
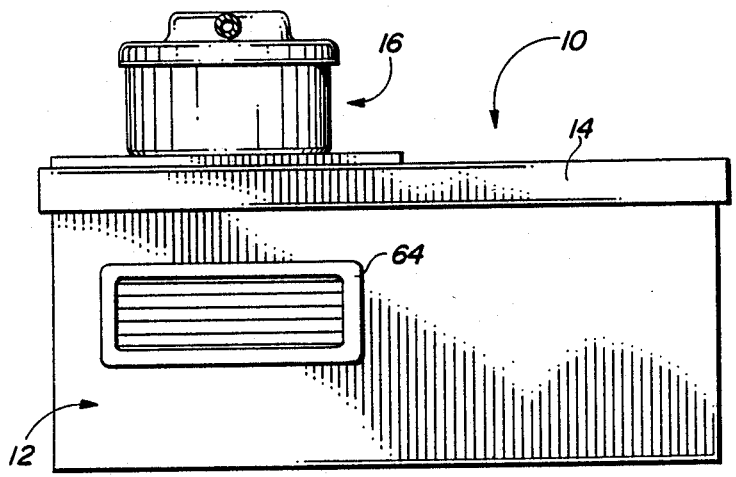
FIG. 2 is a schematic view of the right-hand end of the arrangement of FIG. 1.
Figure 3:
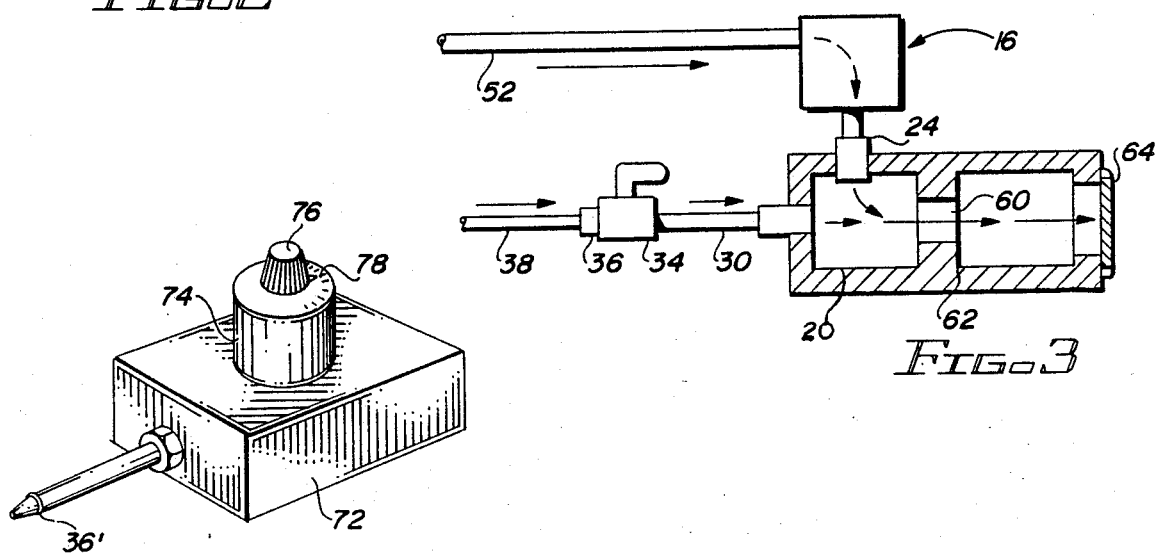
FIG. 3 is a schematic block diagram of the arrangement of FIG. 1.

As particularly shown in the view of FIGS. 1 and 2 and in the block diagram of FIG. 3, a preferred embodiment 10 of the present invention comprises a box-like housing 12 having a lid 14 (indicated as removed in FIG. 1) which encloses the operative elements of the device 10, except for the strainer/trap 16 that is shown supported on top of the box 12. Within the housing 12 is a transducer 20 having an inlet end 22 for coupling to a source of pressurized air, a vacuum port 24 and an outlet end 26 for exhausting air from the transducer 20. Coupled to the inlet end 22 is an adapter 30, a length of tubing 32, an air valve 34, and a coupler 36 for coupling to a shop air line (indicated schematically as 38).

A first vacuum line 40 is coupled via an adapter 42 to the vacuum port 24 of transducer 20. This line 40 is connected at its other end to strainer/trap 16, also referred to herein as a filter 16, which is mounted in place above the housing 12. The filter 16 is a commercially available item comprising a bowl 46 which may be unscrewed or otherwise released from installation with a lid 48. The filter 16 contains or, in the case of disposable units comprises, a filter element within or as part of the bowl 46. A tube 50 is mounted on the lid 48 of the filter 16 to receive suction air through a second vacuum line 52 and interchangeable nozzle 54 at the remote end of the line 52. Air flow through the vacuum intake tube 50 is directed into the filter 16 and through the filter element therein before exiting at the coupling 41 connected the vacuum line 40.

The exhaust end 26 of the transducer 20 is connected to an exhaust muffler 60 which is shown entering a block 62 of static dissipative material which is hollowed out to provide an exhaust muffling chamber that communicates with the air outlet 64, shown in FIG. 2. The block 62 is constructed of a suitable static dissipative material, such as carbon loaded polyethylene or polyurethane foam, for example.

In operation, the device is connected to a shop air line 38 via coupling 36, and the control lever 35 of air valve 34 is turned to inline position to open the valve. Pressurized air then flows through the transducer or vacuum venturi 20, on into the exhaust muffler 60, 62 from the exhaust end 26 and eventually out the exhaust vents 64. This pressurized air flow develops a vacuum at the vacuum port 24 by virtue of the venturi effect. This vacuum is directed through lines 40 and 52 to the point of application of the vacuum cleaner where interchangeable nozzles such as 54 are used to pick up the debris that is to be gathered by the vacuum cleaner. As it flows through the filter 16 between vacuum lines 40 and 52, the debris comprising solid particles and/or liquids which might be contaminants and the like are trapped in the filter element so that the air from the vacuum line flowing into the transducer 20 and vacuum port 24 is clean and suitable for exhaust into the environment.

The entire assembly is constructed of materials which provide automatically for the dissipation of any electrostatic charges which might be generated by air flow or other phenomena. The transducer 20 is enclosed within the housing 12 and may also be packed with static dissipative foam similar to the carbon loaded polyethylene material of the muffler/exhaust block 62. Similarly, the vacuum lines 40, 52 and the housing of the filter 16 are treated or fabricated of suitable materials so as to be dissipative of static charges. Thus the unit 10 is safe for use with charge-sensitive electronic devices such as computer chips and the like which may be mounted on circuit boards or other electronic assemblies which the present invention is designed to serve in cleaning.

Figure 4:
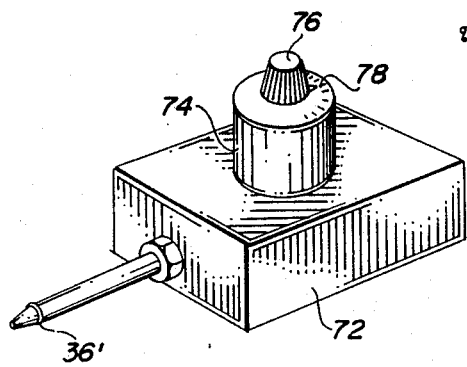
FIG. 4 is a perspective view of an alternative element of the invention shown in FIG. 1.

FIG. 4 represents a combination regulator and valve which may be substituted for the control valve 34 of FIG. 1. This regulator/valve 70 of FIG. 4 has a coupling 36' for connection to a shop air line and an exhaust port (not shown), similar to the couplings to the valve 34 as shown in FIG. 1. The unit 70 comprises a base element 72 and a regulator element 74 with a thumbscrew 76 and a dial 78 which is used in setting the thumbscrew 76 to vary the operating pressure of the regulator 70. The transducer 20 develops varying levels of vacuum at the vacuum port 24 as a function of the air pressure and flow through the transducer 20. Thus adjusting the thumbscrew 76 of the regulator 70 enables the user to generate different levels of vacuum in the vacuum generator of the present invention. A regulator valve 70 like that of FIG. 4 is available from the McMaster-Carr Supply Co. of Los Angeles, California as Model 4891K51. For convenience, as in a permanent installation of a device in accordance with the invention at a shop bench or the like, it may be preferable to install a foot-operated valve in the line 32, 36 in place of manual valve 34. Other variations of the invention particularly suited to specific installations and needs may be developed, as desired.

The device of the invention is an extremely versatile and effective unit for use as a small, portable vacuum source. As a vacuum cleaner for electronic assemblies, as described hereinabove, the vacuum unit may be used to remove contaminants and debris during manual handling operations of electronic assemblies and the like. The small diameter vacuum hose with suitably designed and shaped pickup nozzles may be used to remove debris from relatively inaccessible points in electronic assemblies. The unit is constructed of all static dissipative materials and is therefore safe to use in and around an Electro Static Discharge (ESD) safe environment.

Units in accordance with the present invention may also be used to evacuate excess air from barrier bags during heat sealing operations. These are also used in electronic assemblies for enclosing circuit boards and the like in static protective bags. Normally there would be no need for the filter 16 in the performance of this function.

The unit of the invention may also be used in conjunction with a suitable nozzle tip to manually select microchips from flat packs and the like and to place them on ceramic substrates. A tip with an open port would be preferred to adjust the vacuum for releasing the chips.

The device of the invention may also be useful in the area of jewelry repair operations where it can be used to capture loose gems, precious metal fillings, and the like within a trap or filter which can then be cleaned and reused to recover the gems and fillings picked up by the vacuum line.

Vacuum units in accordance with the present invention provide an extremely effective vacuum source which is better suited to cleaning and decontaminating electronic assemblies than the types of vacuum devices that are presently known. The sound level of the unit when in operation is substantially lower than that which is generated by vacuums that are presently used, thus affording a welcome relief to plant workers. Because this unit is air driven, rather than being electrically powered, and because of the static dissipative materials used in the construction of the components of the unit, embodiments of the invention are safe to use in explosive environments and in the cleaning of sensitive microelectronic elements and components.

Although there have been described above specific arrangements of an electrostatic-safe, air-powered, miniature vacuum generator in accordance with the invention for the purpose of illustrating the manner in which the invention may be used to advantage, it will be appreciated that the invention is not limited thereto. Accordingly, any and all modifications, variations or equivalent arrangements which may occur to those skilled in the art should be considered to be within the scope of the invention as defined in the annexed claims.

What is claimed is:

1. A miniaturized, air-powered, vacuum source apparatus comprising:
   a vacuum generator having a first inlet for pressurized air, a second inlet comprising a venturi inlet for developing a vacuum at a vacuum port of the vacuum generator during the flow of pressurized air through the generator, and an outlet for air from both of said inlets;
   tube means for coupling the first inlet to a pressurized air line;

exhaust means coupled to said outlet for exhausting to the environment air entering the generator from both of said inlets; and a housing for installing the above-mentioned elements in said apparatus, said housing containing a block of static dissipative material having a hollowed out chamber therein inn communicative flow relationship with said exhaust means for muffling air exhaust noise.

2. The apparatus of claim 1 wherein said static dissipative material is carbon loaded polyethylene.

3. The apparatus of claim 1 further including valve means interposed in series with said tube means for turning the apparatus on and off.

4. The apparatus of claim 1 further including a vacuum line having proximal and distal ends thereof, the proximal end being coupled to said vacuum port for applying vacuum at selected points in the vicinity of the distal end of said vacuum line.

5. The apparatus of claim 4 further including filtering means installed in series with said vacuum line for trapping debris and contaminants which are drawn into the distal end of said vacuum line.

6. The apparatus of claim 5 wherein said filtering means comprises a filter housing having inlet and outlet ports and a filter element installed in the path of air flowing through the filtering means between said inlet and outlet ports.

7. The apparatus of claim 6 wherein said filter element is removable from said filtering means for cleaning or replacement.

8. The apparatus of claim 6 wherein said vacuum line and filter element are fabricated of static dissipative material to prevent the buildup of static charge.

9. The apparatus of claim 4 further including a nozzle coupled to the distal end of the vacuum line.

10. The apparatus of claim 9 wherein said nozzle is configured for vacuuming debris from a cleanup area.

11. The apparatus of claim 9 wherein said nozzle is configured to apply vacuum to draw microelectronics parts from a storage pack for installation in a selected assembly.

12. The apparatus of claim 1 wherein the exhaust means further include an exhaust muffler connected to the outlet of the vacuum generator and wherein said block of static dissipative material includes one wall adjacent the vacuum generator and defining an opening in which the exhaust muffler is mounted.

13. The apparatus of claim 12 further including an exhaust vent in an end of the housing adjacent said hollow chamber, said hollow chamber having a second wall remote from said one wall and defining an exhaust opening aligned with said exhaust vent.

* * * * *